(12) United States Patent
Lin

(10) Patent No.: US 6,949,448 B2
(45) Date of Patent: Sep. 27, 2005

(54) LOCAL OXIDATION OF SILICON (LOCOS) METHOD EMPLOYING GRADED OXIDATION MASK

(75) Inventor: Shih-Chi Lin, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 10/405,708

(22) Filed: Apr. 1, 2003

(65) Prior Publication Data

US 2004/0198020 A1 Oct. 7, 2004

(51) Int. Cl.[7] ............................................. H01L 21/76
(52) U.S. Cl. ........................ 438/439; 438/444; 438/791
(58) Field of Search ................................. 438/439, 444, 438/791

(56) References Cited

U.S. PATENT DOCUMENTS

| | | | | | |
|---|---|---|---|---|---|
| 4,333,964 | A | * | 6/1982 | Ghezzo | 438/439 |
| 4,952,525 | A | * | 8/1990 | van der Plas | 438/443 |
| 5,260,229 | A | * | 11/1993 | Hodges et al. | 438/448 |
| 5,294,563 | A | * | 3/1994 | Rao | 438/448 |
| 5,616,401 | A | * | 4/1997 | Kobayashi et al. | 428/212 |
| 5,661,072 | A | * | 8/1997 | Jeng | 438/439 |
| 5,846,596 | A | | 12/1998 | Shim et al. | 427/96 |
| 6,033,971 | A | * | 3/2000 | Motonami et al. | 438/444 |
| 6,051,511 | A | | 4/2000 | Thakur et al. | 438/791 |
| 6,071,793 | A | | 6/2000 | Peidous et al. | 438/424 |
| 6,090,686 | A | | 7/2000 | Brady et al. | 438/439 |
| 6,248,669 | B1 | * | 6/2001 | Ichikawa et al. | 438/717 |

OTHER PUBLICATIONS

Stanley Wolf, "Silicon Processing for The VLSI Era", vol. 2 : Process Integration, Lattice Press (Sunset Beach, CA), 1990, pp 33–35.

* cited by examiner

*Primary Examiner*—Christian Wilson
(74) *Attorney, Agent, or Firm*—Thomas, Kayden, Horstemeyer & Risley

(57) ABSTRACT

A method for forming a local oxidation of silicon (LOCOS) isolation region on a silicon substrate. A series of patterned graded oxidation mask layers formed of a material comprising silicon, oxygen and nitrogen is formed. The series of patterned graded oxidation mask layers has a comparatively high nitrogen:oxygen atomic ratio within a series of first contiguous sub-layers; a comparatively high nitrogen:oxygen atomic ratio within a series of third contiguous sub-layers; and a comparatively low nitrogen:oxygen atomic ratio within a series of second contiguous sub-layers.

19 Claims, 1 Drawing Sheet

LOCAL OXIDATION OF SILICON (LOCOS) METHOD EMPLOYING GRADED OXIDATION MASK

BACKGROUND OF THE INVENTION

1. Field of the Invention

The present invention relates generally to local oxidation of silicon (LOCOS) methods for forming isolation regions within semiconductor integrated circuit microelectronic fabrications. More particularly, the present invention relates the local oxidation of silicon (LOCOS) methods for forming, with enhanced properties, isolation regions within semiconductor integrated circuit microelectronic fabrications.

2. Description of the Related Art

Semiconductor integrated circuit microelectronic fabrications are formed from semiconductor substrates within and upon which are formed semiconductor devices, such as but not limited to resistors, transistors, diodes and capacitors. In turn, the semiconductor devices formed within and upon the semiconductor substrates are connected and interconnected with patterned microelectronic conductor layers which are separated by microelectronic dielectric layers.

Common in the art of semiconductor integrated circuit microelectronic fabrication is the use of isolation methods for forming isolation regions which are employed for isolating active regions of a semiconductor substrate within and upon which are formed semiconductor devices. Such isolation methods for forming isolation regions which are employed for isolating active regions of a semiconductor substrate within and upon which are formed semiconductor devices are typically intended to provide electrical isolation to the semiconductor devices such as to provide enhanced semiconductor integrated circuit microelectronic fabrication performance and reduced semiconductor device cross-talk.

Of the isolation methods and isolation regions which may be employed for isolating active regions of a semiconductor substrate, local oxidation of silicon (LOCOS) isolation methods and local oxidation of silicon (LOCOS) isolation regions are particularly common in the art of semiconductor integrated circuit microelectronic fabrication. As is understood by a person skilled in the art, local oxidation of silicon (LOCOS) methods typically employ, at least in part, a silicon nitride oxidation mask which masks an active region of a silicon semiconductor substrate, while an adjacent exposed region of the silicon semiconductor substrate is thermally oxidized within a thermal annealing oxidizing environment to form therefrom a local oxidation of silicon (LOCOS) isolation region which bounds the active region of the silicon semiconductor substrate.

While local oxidation of silicon (LOCOS) methods have become quite common in the art of semiconductor integrated circuit microelectronic fabrication for forming local oxidation of silicon (LOCOS) isolation regions within semiconductor integrated circuit microelectronic fabrications, local oxidation of silicon (LOCOS) methods and local oxidation of silicon (LOCOS) isolation regions are nonetheless not entirely without problems in the art of semiconductor integrated circuit microelectronic fabrication. In that regard, local oxidation of silicon (LOCOS) methods and local oxidation of silicon (LOCOS) isolation regions typically suffer from problems including but not limited to: (1) bird's beak encroachments of local oxidation of silicon (LOCOS) isolation regions beneath silicon nitride oxidation masks employed within local oxidation of silicon (LOCOS) methods; and (2) related silicon nitride oxidation mask physical stresses which in-part may result from bird's beak encroachments of local oxidation of silicon (LOCOS) isolation regions formed beneath silicon nitride oxidation masks employed within local oxidation of silicon (LOCOS) methods.

It is thus desirable in the art of semiconductor integrated circuit microelectronic fabrication to provide local oxidation of silicon (LOCOS) methods through which local oxidation of silicon (LOCOS) isolation regions may be formed with enhanced properties, in particular as directed towards attenuated bird's beak encroachments of local oxidation of silicon (LOCOS) isolation regions beneath silicon nitride oxidation masks employed within local oxidation of silicon (LOCOS) isolation methods.

It is towards the foregoing object that the present invention is directed.

Various local oxidation of silicon (LOCOS) methods have been disclosed in the art of semiconductor integrated circuit microelectronic fabrication for forming local oxidation of silicon (LOCOS) isolation regions with desirable properties in the art of semiconductor integrated circuit microelectronic fabrication.

For example, Wolf, in Silicon Processing for the VLSI Era, Vol. 2—Process Integration, Lattice Press (Sunset beach, Calif.) (1990), pp. 33–35, discloses a local oxidation of silicon (LOCOS) method for forming, with an attenuated bird's beak encroachment beneath a silicon nitride oxidation mask, a local oxidation of silicon (LOCOS) isolation region within a silicon semiconductor substrate within a semiconductor integrated circuit microelectronic fabrication. To realize the foregoing result, the local oxidation of silicon (LOCOS) method employs a sealed interface local oxidation (SILO) local oxidation of silicon (LOCOS) method which employs the silicon nitride oxidation mask formed directly upon the silicon semiconductor substrate, rather than formed upon a silicon oxide pad oxide layer in-turn formed directly upon the silicon semiconductor substrate.

In addition, Kobayashi et al., in U.S. Pat. No. 5,616,401, similarly also discloses a local oxidation of silicon (LOCOS) method for forming, with an attenuated bird's beak encroachment beneath a silicon nitride oxidation mask, a local oxidation of silicon (LOCOS) isolation region with a silicon semiconductor substrate employed within a semiconductor integrated circuit microelectronic fabrication. To realize the foregoing result, the local oxidation of silicon (LOCOS) method employs as an adjunct to, or in the alternative of, a silicon oxide pad oxide layer formed beneath the silicon nitride oxidation mask, a silicon oxynitride layer formed with a graded concentration of oxygen with respect to nitrogen, wherein an oxygen rich portion of the silicon oxynitride layer is formed more closely adjacent the silicon semiconductor substrate.

Further, Shim et al., in U.S. Pat. No. 5,846,596, similarly also discloses a local oxidation of silicon (LOCOS) method for forming, with an attenuated bird's beak encroachment beneath a silicon nitride oxidation mask, a local oxidation of silicon (LOCOS) isolation region within a silicon semiconductor substrate within a semiconductor integrated circuit microelectronic fabrication. To realize the foregoing result, the local oxidation of silicon (LOCOS) method employs an oxidation resistant spacer formed adjoining a sidewall of the silicon nitride oxidation mask and covering an edge portion of a pad oxidation layer formed upon a surface of the semiconductor substrate within which is to be formed the local oxidation of silicon (LOCOS) isolation region while employing the local oxidation of silicon (LOCOS) method.

Yet further, Thakur et al., in U.S. Pat. No. 6,051,511, discloses a method for forming, with attenuated physical stress, a silicon nitride oxidation mask which may be employed within a local oxidation of silicon (LOCOS) method for forming a local oxidation of silicon (LOCOS) isolation region within a silicon semiconductor substrate employed within a semiconductor integrated circuit microelectronic fabrication. To realize the foregoing result, the method employs forming the silicon nitride oxidation mask while employing a silicon nitride material which has a graded concentration of silicon with respect to nitrogen.

Still yet further, Peidous et al., in U.S. Pat. No. 6,071,793, discloses yet another local oxidation of silicon (LOCOS) method for forming, with an attenuated bird's beak encroachment beneath a silicon nitride oxidation mask, a local oxidation of silicon (LOCOS) isolation region within a silicon semiconductor substrate within a semiconductor integrated circuit microelectronic fabrication. To realize the foregoing result, the local oxidation of silicon (LOCOS) method employs the silicon nitride oxidation mask which has formed therein at a base of its sidewall a tapered foot which protrudes over and resiliently constrains the local oxidation of silicon (LOCOS) isolation region which is formed employing the local oxidation of silicon (LOCOS) method.

Finally, Brady et al., in U.S. Pat. No. 6,090,686, similarly also discloses a method for forming, with attenuated physical stress, a silicon nitride oxidation mask which may be employed within a local oxidation of silicon (LOCOS) method for forming a local oxidation of silicon (LOCOS) isolation region within a silicon semiconductor substrate employed within a semiconductor integrated circuit microelectronic fabrication. To realize the foregoing object, the silicon nitride oxidation mask is formed as a multi-layer silicon nitride oxidation mask, where sub-layers within the multi-layer silicon nitride oxidation mask are formed employing different deposition rates.

Desirable in the art of semiconductor integrated circuit microelectronic fabrication are additional local oxidation of silicon (LOCOS) methods through which local oxidation of silicon (LOCOS) isolation regions may be formed with enhanced properties within semiconductor integrated circuit microelectronic fabrication, in particular as directed towards attenuated bird's beak encroachments of local oxidation of silicon (LOCOS) isolation regions beneath silicon nitride oxidation masks employed within the local oxidation of silicon (LOCOS) methods.

It is towards the foregoing object that the present invention is directed.

SUMMARY OF THE INVENTION

A first object of the present invention is to provide a local oxidation of silicon (LOCOS) method for forming a local oxidation of silicon (LOCOS) isolation region within a semiconductor substrate.

A second object of the present invention is to provide a local oxidation of silicon (LOCOS) method in accord with the first object of the present invention, wherein the local oxidation of silicon (LOCOS) isolation region is formed with enhanced properties.

A third object of the present invention is to provide a local oxidation of silicon (LOCOS) method in accord with the first object of the present invention and the second object of the present invention, wherein the local oxidation of silicon (LOCOS) method is readily commercially implemented.

In accord with the objects of the present invention, there is provided by the present invention a local oxidation of silicon (LOCOS) method for forming a local oxidation of silicon (LOCOS) isolation region. To practice the method of the present invention, there is first provided a silicon semiconductor substrate. There is then formed upon the silicon semiconductor substrate a graded oxidation mask formed of a material comprising silicon, oxygen and nitrogen. Within the present invention, the graded oxidation mask has a comparatively high nitrogen:oxygen atomic ratio at both an interface of the graded oxidation mask with the silicon semiconductor substrate and at an exposed surface of the graded oxidation mask. Within the present invention, the graded oxidation mask also has a comparatively low nitrogen:oxygen atomic ratio centered within a thickness of the graded oxidation mask. There is then thermally oxidized, while employing the graded oxidation mask, portions of the silicon semiconductor substrate exposed adjacent the graded oxidation mask, to form therefrom a series of silicon oxide isolation regions within the silicon semiconductor substrate.

The present invention provides a local oxidation of silicon (LOCOS) method for forming a local oxidation of silicon (LOCOS) isolation region within a semiconductor substrate, wherein the local oxidation of silicon (LOCOS) isolation region is formed with enhanced properties. The present invention realizes the foregoing objects by forming, within the context of a local oxidation of silicon (LOCOS) oxidation method, upon a silicon semiconductor substrate a graded oxidation mask formed of a material comprising silicon, oxygen and nitrogen. Within the present invention, the graded oxidation mask has a comparatively high nitrogen:oxygen atomic ratio at both an interface of the graded oxidation mask with the silicon semiconductor substrate and at an exposed surface of the graded oxidation mask. Within the present invention, the graded oxidation mask also has a comparatively low nitrogen:oxygen atomic ratio centered within a thickness of the graded oxidation mask. Thus, and also within the context of the present invention, when there is thermally oxidized, while employing the graded oxidation mask, portions of the silicon semiconductor substrate exposed adjacent the graded oxidation mask, to form therefrom a series of silicon oxide isolation regions within the silicon semiconductor substrate, the series of silicon oxide isolation regions is formed with attenuated encroachment beneath the graded oxidation mask, which in turn provides less physical stress within the graded oxidation mask.

The local oxidation of silicon (LOCOS) method of the present invention is readily commercially implemented. The present invention employs methods and materials as are generally known in the art of semiconductor integrated circuit microelectronic fabrication, but employed within the context of specific process limitations and materials constraints to provide the present invention. Since it is thus at least in part a series of process limitations and materials constraints which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a local oxidation of silicon (LOCOS) method for forming a local oxidation of silicon (LOCOS) isolation region within a semiconductor substrate, wherein the local oxidation of silicon (LOCOS) isolation region is formed with enhanced properties. The present invention realizes the foregoing object by forming, within the context of a local oxidation of silicon (LOCOS) method, and upon a silicon semiconductor substrate, a graded oxidation mask formed of a material comprising silicon, oxygen and nitrogen. Within the present invention, the graded oxidation mask has a comparatively high nitrogen:oxygen atomic ratio at both an interface of the graded oxidation mask with the silicon semiconductor substrate and at an exposed surface of the graded oxidation mask. Within the present invention, the graded oxidation mask also has a comparatively low nitrogen:oxygen atomic ratio centered within a thickness of the graded oxidation mask. Thus, and also within the context of the present invention, when there is thermally oxidized, while employing the graded oxidation mask, portions of the silicon semiconductor substrate exposed adjacent the graded oxidation mask, to form therefrom a series of silicon oxide isolation regions within the silicon semiconductor substrate, the series of silicon oxide isolation regions is formed with attenuated encroachment beneath the graded oxidation mask, which in turn provides less physical stress within the graded oxidation mask.

Although the preferred embodiment of the present invention illustrates the present invention within the context of forming a graded oxidation mask with specific silicon nitride and silicon oxide compositions within its thickness for use most specifically as an oxidation mask within a local oxidation of silicon (LOCOS) method, a graded silicon, oxygen and nitrogen containing layer formed in accord with the present invention may be employed as a layer other than an oxidation mask (such as but not limited to a dielectric layer or an optical control layer) within fabrications such as but not limited to microelectronic fabrications and optical fabrications. In accord with the present invention, such a graded silicon, oxygen and nitrogen containing layer will have a comparatively high nitrogen:oxygen atomic ratio within a pair of contiguous sub-layers which includes a pair of opposite surfaces of the graded silicon, oxygen and nitrogen containing layer and a comparatively low nitrogen:oxygen atomic ratio centered within a thickness of the graded silicon, nitrogen and oxygen containing layer.

Referring now to FIG. 1 to FIG. 4, there is shown a series of schematic cross-sectional diagrams illustrating the results of progressive stages in forming, in accord with a preferred embodiment of the present invention, a pair of local oxidation of silicon (LOCOS) isolation regions within a silicon semiconductor substrate within a semiconductor integrated circuit microelectronic fabrication.

Figure 1:
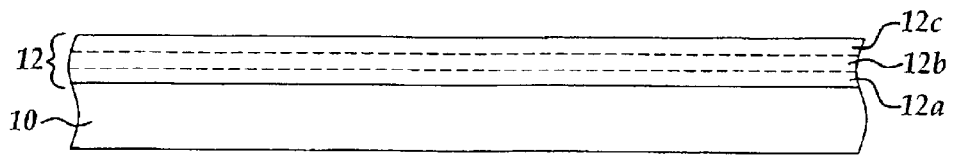
FIG. 1, FIG. 2, FIG. 3 and FIG. 4 show a series of schematic cross-sectional diagrams illustrating the results of progressive stages in forming, in accord with a preferred embodiment of the present invention, a pair of local oxidation of silicon (LOCOS) isolation regions within a silicon semiconductor substrate employed within a semiconductor integrated circuit microelectronic fabrication.

Shown in FIG. 1 is a schematic cross-sectional diagram of the semiconductor integrated circuit microelectronic fabrication at an early stage in its fabrication in accord with the preferred embodiment of the present invention.

Shown in FIG. 1 is a silicon semiconductor substrate 10 having formed thereupon a blanket graded oxidation mask layer 12.

Within the preferred embodiment of the present invention with respect to the silicon semiconductor substrate 10, the silicon semiconductor substrate 10 is formed from a silicon semiconductor material as is otherwise conventional in the art of semiconductor integrated circuit microelectronic fabrication, such silicon semiconductor materials typically and preferably including monocrystalline silicon semiconductor materials having any of several crystallographic orientations and dopant concentrations. Typically and preferably, the silicon semiconductor substrate 10 is formed of a (100) silicon semiconductor material having an N- or P-dopant concentration. Within the present invention, the silicon semiconductor substrate 10 may be employed within a semiconductor integrated circuit microelectronic fabrication including but not limited to a logic semiconductor integrated circuit microelectronic fabrication, a memory semiconductor integrated circuit microelectronic fabrication and a hybrid logic and memory semiconductor integrated circuit microelectronic fabrication.

Within the preferred embodiment of the present invention with respect to the blanket graded oxidation mask layer 12, it is at least in part a compositional variation of the blanket graded oxidation mask layer 12 which provides at least in part the present invention. In that regard, and in a first instance, the blanket graded oxidation mask layer 12 is formed in general of a silicon, oxygen and nitrogen containing material, but with compositional variations of nitrogen content and oxygen content as noted as follows. First, the blanket graded oxidation mask 12 comprises formed upon the silicon semiconductor substrate 10 a blanket first nitrogen rich contiguous sub-layer 12a which forms a lower portion of the blanket graded oxidation mask layer 12. Similarly, the blanket graded oxidation mask 12 comprises formed upon the blanket first nitrogen rich contiguous sub-layer 12a a blanket oxygen rich contiguous sub-layer 12b which forms a central portion of the blanket graded oxidation mask layer 12. Finally, the blanket graded oxidation mask layer 12 comprises formed upon the blanket oxygen rich contiguous sub-layer 12b a blanket second nitrogen rich contiguous sub-layer 12c which forms an upper portion of the blanket graded oxidation mask layer 12.

Typically and preferably, within the context of the present invention, the blanket first nitrogen rich contiguous sub-layer 12a is formed to a thickness of from about 100 to about 200 angstroms, the blanket oxygen rich contiguous sub-layer 12b is formed to a thickness of from about 150 to about 250 angstroms and the blanket second nitrogen rich contiguous sub-layer 12c is formed to a thickness of from about 1200 to about 1600 angstroms, to provide the blanket graded oxidation mask layer 12 of total thickness from about 1450 to about 2000 angstroms.

Figure 5:
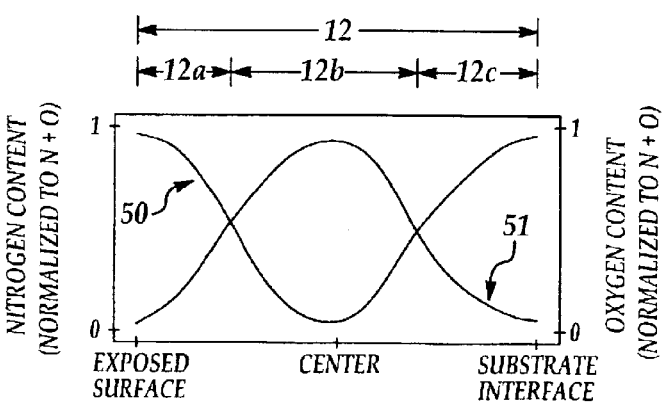
FIG. 5 shows a graph of Nitrogen Content (normalized to nitrogen and oxygen) and Oxygen Content (normalized to nitrogen and oxygen) versus Blanket Graded Oxidation Mask Layer Thickness, for a blanket graded oxidation mask layer or a patterned graded oxidation mask layer formed in accord with the preferred embodiment of the present invention.

To more completely illustrate the nature of the compositional variations of the blanket graded oxidation mask layer 12 as a function of depth within a total thickness of the blanket graded oxidation mask layer 12, there is shown within FIG. 5 a graph of Blanket Graded Oxidation Mask Layer Thickness versus both Nitrogen Content (normalized to nitrogen content plus oxygen content (i.e., left axis)) and Oxygen Content (normalized to nitrogen content plus oxygen content (i.e., right axis)). Within the graph as illustrated within FIG. 5, the curve which corresponds with reference numeral 50 corresponds with nitrogen content within the blanket graded oxidation mask layer 12 as illustrated within the schematic cross-sectional diagram of FIG. 1, while the curve which corresponds with reference numeral 51 corresponds with oxygen content within the blanket graded oxidation mask layer 12 as illustrated within the schematic cross-sectional diagram of FIG. 1. Consistent with that which is noted above, the blanket graded oxidation mask layer 12 has: (1) a comparatively high and continuously graded nitrogen content at a pair of contiguous sub-layers including both its exposed surface and at its interface with the silicon semiconductor substrate 10; and (2) a comparatively low and continuously graded nitrogen content within a contiguous sub-layer centered within the thickness of the blanket graded oxidation mask layer 12. In general, and as is also illustrated within the graph of FIG. 5, the blanket graded oxidation mask layer 12 has a normalized nitrogen content of from about 50 to about 100 atomic percent within the blanket first nitrogen rich contiguous sub-layer 12a and the blanket second nitrogen rich contiguous sub-layer 12c, while also having a normalized oxygen content of from about 50 to about 100 percent within the blanket oxygen rich contiguous sub-layer 12b.

Although the blanket graded oxidation mask layer 12 may be formed with the graded composition as noted above while employing any of several methods, including but not limited to reactive sputtering methods, thermal chemical vapor deposition (CVD) methods and plasma enhanced chemical vapor deposition (PECVD) methods, for the preferred embodiment of the present invention, the blanket graded oxidation mask layer 12 is typically and preferably formed employing a low pressure chemical vapor deposition (CVD) method employing dichlorosilane ($SiH_2Cl_2$) as a silicon source material, ammonia ($NH_3$) as a nitrogen source material and nitrous oxide ($N_2O$) as an oxidant source material, although other silicon source materials (such as but not limited to disilane and various chlorosilanes), nitrogen source materials (such as but not limited to hydrazine) and oxygen source materials (such as but not limited to oxygen, ozone and nitric oxide) may also be employed when forming the blanket graded oxidation mask layer 12. Similarly, as is also understood by a person skilled in the art, the nitrogen graded compositional variations and oxygen graded compositional variations within the blanket first nitrogen rich contiguous sub-layer 12a, the blanket oxygen rich contiguous sub-layer 12b and the blanket second nitrogen rich contiguous sub-layer 12c are typically and preferably effected while maintaining a silane silicon source material flow rate nominally constant, and while simultaneously varying inversely a nitrogen source material flow rate with respect to an oxygen source material flow rate. Typically and preferably, the low pressure chemical vapor deposition (CVD) method through which is formed the blanket graded oxidation mask layer 12 also employs: (1) a reactor chamber pressure of from about 0.25 to about 0.45 torr; (2) a semiconductor substrate 10 temperature of from about 750 degrees centigrade to about 850 degrees centigrade; (3) a dichlorosilane silicon source material flow rate of from about 50 sccm; (4) an ammonia nitrogen source material flow rate of about 0 to about 400 standard cubic centimeters per minute (sccm); and (5) a nitrous oxide oxygen source material flow rate of from about 0 to about 400 standard cubic centimeters per minute (sccm).

Figure 2:
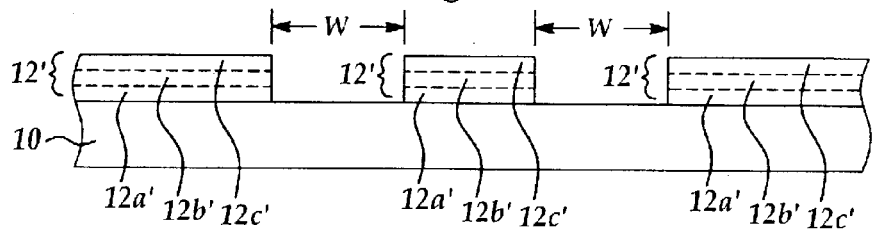

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein the blanket graded oxidation mask layer 12 has been patterned to form a corresponding series of patterned graded oxidation mask layers 12' which comprises in pertinent portions a series of patterned first nitrogen rich contiguous sub-layers 12a' having formed thereupon a series of patterned oxygen rich contiguous sub-layers 12b' in turn having formed thereupon a series of patterned second nitrogen rich contiguous sub-layers 12c'.

Within the preferred embodiment of the present invention, the blanket graded oxidation mask layer 12 as illustrated within the schematic cross-sectional diagram of FIG. 1 may be patterned to form the series of patterned graded oxidation mask layers 12' as illustrated within the schematic cross-sectional diagram of FIG. 2 while employing patterning methods as are conventional in the art of semiconductor integrated circuit microelectronic fabrication, such patterning methods typically and preferably employing photolithographic methods and plasma etch methods which employ etchant gas compositions which upon plasma activation provide active fluorine containing etchant species.

Figure 3:
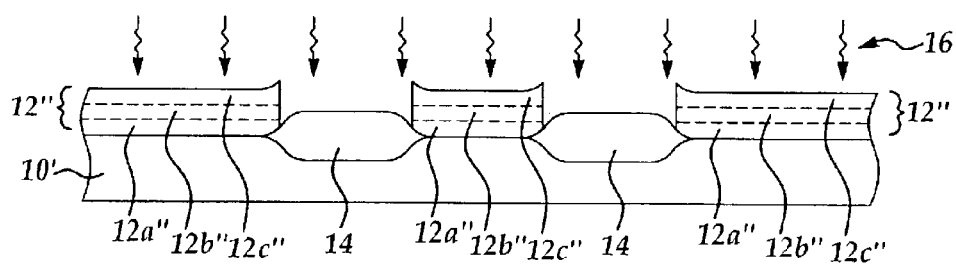

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein the semiconductor substrate 10 having formed thereupon the series of patterned graded oxidation mask layers 12' as illustrated within the schematic cross-sectional diagram of FIG. 2 has been thermally annealed within a thermal annealing oxidizing environment 16 to form through in-situ oxidation of portions of the silicon semiconductor substrate 10 exposed adjacent the series of patterned graded oxidation mask layers 12' a pair of isolation regions 14, while simultaneously: (1) forming from the silicon semiconductor substrate 10 a partially consumed silicon semiconductor substrate 10'; and (2) forming from the series of patterned graded oxidation mask layers 12' comprising the series of patterned first nitrogen rich contiguous sub-layers 12a' having formed thereupon the series of patterned oxygen rich contiguous sub-layers 12b' in turn having formed thereupon the series of patterned second nitrogen rich contiguous sub-layers 12c' a corresponding series of deformed patterned graded oxidation mask layer 12" comprising a series of deformed patterned first nitrogen rich contiguous sub-layers 12a" having formed thereupon a series of deformed patterned oxygen rich contiguous sub-layers 12b" in turn having formed thereupon a series of deformed patterned second nitrogen rich contiguous sub-layers 12c".

Within the preferred embodiment of the present invention, the thermal annealing oxidizing environment 16 which is employed for forming from the semiconductor integrated circuit microelectronic fabrication whose schematic cross-sectional diagram is illustrated in FIG. 2 the semiconductor integrated circuit microelectronic fabrication whose schematic cross-sectional diagram is illustrated in FIG. 3 may employ oxidants including but not limited to oxygen, ozone, nitrous oxide, nitric oxide and steam. Typically and preferably, the thermal annealing oxidizing environment 16 employs at least either oxygen or steam at a temperature of from about 950 to about 1100 degrees centigrade, to form within and upon the partially consumed silicon semiconductor substrate 10' the pair of isolation regions 14 of thickness about 4000 to about 6000 angstroms.

As is understood by a person skilled in the art, and in accord with the references cited within the Description of the Related Art, the teachings of all of which related art are incorporated herein fully by reference, by employing within the context of the present invention the series of patterned graded oxidation mask layers 12' having the series of patterned first nitrogen rich contiguous sub-layers 12a', the interfaces of the series of patterned graded oxidation mask layers 12' with the silicon semiconductor substrate 10 is sealed such as to attenuate lateral encroachment of the isolation regions 14 and bird's beak formation beneath the edges of the series of deformed patterned graded oxidation mask layers 12". Similarly, as is also understood by a person skilled in the art, by employing when forming the blanket graded oxidation mask 12 and the series of patterned graded oxidation mask layers 12' the blanket oxygen rich contiguous sub-layer 12b interposed between the blanket first nitrogen rich contiguous sub-layer 12a and the blanket second nitrogen rich contiguous sub-layer 12c, there is similarly also optimally attenuated additional intrinsic stress within the blanket graded oxidation mask 12 and the resulting series of patterned graded oxidation mask layers 12'.

Figure 4:
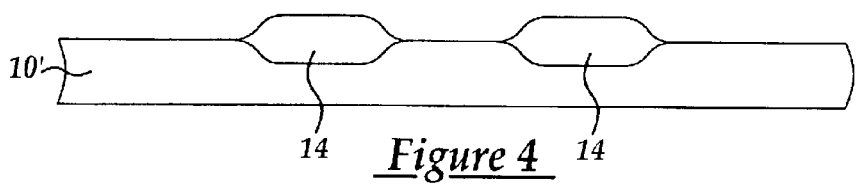

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein there has been stripped from the semiconductor integrated circuit microelectronic fabrication the series of deformed patterned graded oxidation mask layers 12".

The series of deformed patterned graded oxidation mask layers 12" may be stripped from the semiconductor integrated circuit microelectronic fabrication whose schematic cross-sectional diagram is illustrated in FIG. 3 to provide in part the semiconductor integrated circuit microelectronic fabrication whose schematic cross-sectional diagram is illustrated in FIG. 4 while employing oxidation mask stripping methods and materials as are conventional in the art of semiconductor integrated circuit microelectronic fabrication, such oxidation mask stripping methods and materials typically and preferably employing wet chemical stripping materials including but not limited to phosphoric acid based wet chemical stripping materials and hydrofluoric acid based wet chemical stripping materials.

Upon forming the semiconductor integrated circuit microelectronic fabrication whose schematic cross-sectional diagram is illustrated in FIG. 4, there is formed a semiconductor integrated circuit microelectronic fabrication in accord with the preferred embodiment of the present invention. For reasons as discussed above within the context of the schematic cross-sectional diagram of FIG. 3, the semiconductor integrated circuit microelectronic fabrication has formed therein a pair of isolation regions 14 formed with attenuated bird's beak encroachment beneath a series of deformed patterned graded oxidation mask layers 12", while providing a series of patterned graded oxidation mask layers 12' and the series of deformed patterned graded oxidation mask layers 12", exhibiting attenuated stress.

As is finally understood by a person skilled in the art, the preferred embodiment of the present invention is illustrative of the present invention rather than limiting of the present invention. Revisions and modifications may be made to methods, materials, structures and dimensions through which is provided a semiconductor integrated circuit microelectronic fabrication in accord with the preferred embodiment of the present invention while, still providing a semiconductor integrated circuit microelectronic fabrication in accord with the present invention, further in accord with the accompanying claims.

What is claimed is:

1. A local oxidation of silicon (LOCOS) method for forming a local oxidation of silicon (LOCOS) isolation region comprising:

providing a silicon-containing semiconductor substrate;

continuously depositing material to form a mask layer comprising silicon, oxygen and nitrogen on the silicon-containing semiconductor substrate by inversely varying a nitrogen source material flow rate with respect to an oxygen source material flow rate to form upper and lower portions of the mask layer with comparatively high nitrogen:oxygen atomic ratios and a central portion of the mask layer with a comparatively low nitrogen:oxygen atomic ratio;

patterning the mask layer to expose portions of the silicon-containing semiconductor substrate; and forming silicon oxide isolation regions on the exposed portions of the silicon-containing semiconductor substrate employing the patterned mask layer.

2. The method as claimed in claim 1, wherein the comparatively low nitrogen:oxygen atomic ratio is less than about 50 percent nitrogen normalized to nitrogen plus oxygen.

3. The method as claimed in claim 1, wherein the comparatively high nitrogen:oxygen atomic ratio is greater than about 50 percent nitrogen normalized to nitrogen plus oxygen.

4. The method as claimed in claim 1, wherein the thickness of the mask layer is from 1650 to about 2000 angstroms; the thickness of the lower portion of the mask layer with comparatively high nitrogen:oxygen atomic ratio is from about 100 to about 200 angstroms; the thickness of the central portion of the mask layer of the mask layer with a comparatively low nitrogen:oxygen atomic ratio is from about 150 to about 250 angstroms; and the thickness of the upper portion of the mask layer with comparatively high nitrogen:oxygen atomic ratio is from about 1200 to about 1600 angstroms.

5. The method as claimed in claim 1, wherein the silicon oxide isolation regions are formed by thermally oxidizing the silicon-containing semiconductor substrate at a temperature of from about 950 to about 1100 degrees centigrade.

6. The method as claimed in claim 1, further comprising stripping the patterned mask layer after the silicon oxide isolation regions are formed.

7. The method as claimed in claim 1, wherein the mask layer is formed employing a chemical vapor deposition method employing a silicon source material, a nitrogen source material and an oxygen source material.

8. The method as claimed in claim 7, wherein the silicon source material is silane or chlorosilanes; the nitrogen source material is ammonia or hydrazine; and the oxygen source material is nitrous oxide, nitric oxide, oxygen or ozone.

9. A method for forming a local oxidation of silicon (LOCOS) isolation region comprising:

providing a silicon-containing semiconductor substrate;

providing a flow of silicon for deposition upon the silicon-containing semiconductor substrate;

providing a flow of nitrogen and a flow of oxygen for deposition upon the silicon-containing semiconductor substrate to form a mask layer;

wherein a rate of the flow of nitrogen and a rate of the flow of oxygen are varied inversely with respect to each other such that, by varying the rate of flow of the nitrogen and the rate of flow of the oxygen, a first portion and a third portion of the mask layer are caused to exhibit comparatively high nitrogen:oxygen atomic ratios, and a second portion of the mask layer, located between the first portion and the second portion, is caused to exhibit a comparatively low nitrogen:oxygen atomic ratio; and wherein, at a first interface between the first portion and the second portion of the mask layer, the nitrogen:oxygen atomic ratio gradually changes from the comparatively high nitrogen:oxygen atomic ratio to the comparatively low nitrogen:oxygen atomic ratio; and thermally oxidizing portions of the silicon-containing semiconductor substrate to form a series of silicon oxide isolation regions within a thermally oxidized silicon semiconductor substrate.

10. The method of claim 9 wherein the silicon semiconductor substrate is employed within a semiconductor integrated circuit microelectronic fabrication selected from the group consisting of logic semiconductor integrated circuit microelectronic fabrications, memory semiconductor integrated circuit microelectronic fabrications and hybrid logic and memory semiconductor integrated circuit microelectronic fabrications.

11. The method of claim 9 wherein the series of silicon oxide isolation regions is formed with an attenuated bird's beak encroachment under the series of patterned graded oxidation mask layers.

12. The method of claim 9 wherein:

the comparatively high nitrogen:oxygen atomic ratio is greater than about 50 percent nitrogen normalized to nitrogen plus oxygen; and the comparatively low nitrogen:oxygen atomic ratio is less than about 50 percent nitrogen normalized to nitrogen plus oxygen.

13. The method of claim 9 wherein:

the mask layer is formed to a thickness of from about 1650 to about 2000 angstroms.

14. The method of claim 9 wherein portions of the silicon semiconductor substrate exposed adjacent the mask layer are thermally oxidized at a temperature of from about 950 to about 1100 degrees centigrade.

15. The method of claim 9 further comprising stripping from the thermally oxidized silicon semiconductor substrate the mask layer.

16. The method of claim 9 wherein:

the mask layer is formed employing a chemical vapor deposition method employing a silicon source material, a nitrogen source material and an oxygen source material.

17. The method of claim 16 wherein:

the silicon source material is selected from the group consisting of silane and chlorosilanes;

the nitrogen source material is selected from the group consisting of ammonia and hydrazine; and the oxygen source material is selected from the group consisting of nitrous oxide, nitric oxide, oxygen and ozone.

18. The method of claim 9, wherein the comparatively high nitrogen:oxygen atomic ratio is greater than about 50 percent nitrogen normalized to nitrogen plus oxygen.

19. The method of claim 9, wherein the comparatively low nitrogen:oxygen atomic ratio is less than about 50 percent nitrogen normalized to nitrogen plus oxygen.

* * * * *